US012550537B2

(12) United States Patent
Jung

(10) Patent No.: US 12,550,537 B2
(45) Date of Patent: Feb. 10, 2026

(54) DISPLAY APPARATUS INCLUDING A SUB-LIGHT EMITTING PORTION

(71) Applicant: LG Display Co., Ltd., Seoul (KR)

(72) Inventor: SungGoo Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 525 days.

(21) Appl. No.: 17/983,090

(22) Filed: Nov. 8, 2022

(65) Prior Publication Data

US 2023/0209907 A1 Jun. 29, 2023

(30) Foreign Application Priority Data

Dec. 29, 2021 (KR) ........................ 10-2021-0190955

(51) Int. Cl.
*H10K 59/122* (2023.01)
*H10K 59/35* (2023.01)

(52) U.S. Cl.
CPC ........... *H10K 59/122* (2023.02); *H10K 59/35* (2023.02)

(58) Field of Classification Search
CPC ............................. H10K 59/122; H10K 59/35
USPC ........................................................... 257/79
See application file for complete search history.

(56) References Cited

U.S. PATENT DOCUMENTS

2020/0194713 A1* 6/2020 Kim ..................... H10K 59/124

FOREIGN PATENT DOCUMENTS

KR 100662979 B1 12/2006

* cited by examiner

*Primary Examiner* — Xia L Cross
(74) *Attorney, Agent, or Firm* — Seed Intellectual Property Law Group LLP

(57) ABSTRACT

A display apparatus is provided, which may improve a viewing angle. The display apparatus comprises a substrate provided with a plurality of subpixels, and a plurality of banks for distinguishing the plurality of subpixels on the substrate, wherein each of the plurality of subpixels includes a main light emitting portion provided between the plurality of banks, and a sub-light emitting portion spaced apart from the main light emitting portion and disposed to be higher than the main light emitting portion.

33 Claims, 7 Drawing Sheets

I - I'
SP SP1 MEL 114 155USS 115USM 117 SEL2 SP2
114b_US MEL1 114a US 1172 1171 SEL2-1 SEL2-2 A
120 116 115 1171a T1 T2 113a 113 111a 111c 111 111b 11 110
12 SEL1-1 SEL1-2 114b MEL2 112c 112b 112a 112d
SEL1 SEL 112

A
SEL2
SEL2-1
SP2
UT
ST
116
115
113
MEL2
W2
W1
1172b-2
1172a
1171
117
1172
1171a
1172b
1172b-1
USS
114b_US
114b
SEL1-2
115a
B
1171b
SP
SP1
US
MEL1
MEL
115b
115USM
114a
114
SEL
SEL1
SEL1-1
115BS
115USS
1171FSS
CRA
1171SS
1171FS
1171

DISPLAY APPARATUS INCLUDING A SUB-LIGHT EMITTING PORTION

CROSS-REFERENCE TO RELATED APPLICATIONS

This application claims the benefit of the Korean Patent Application No. 10-2021-0190955 filed on Dec. 29, 2021, which is hereby incorporated by reference as if fully set forth herein.

BACKGROUND

Technical Field

The present disclosure relates to a display apparatus.

Description of the Related Art

With the advancement of the information age, the demand for a display apparatus for displaying an image has increased in various forms. Therefore, various types of display apparatuses such as a liquid crystal display (LCD) apparatus, a plasma display panel (PDP) apparatus, an organic light emitting display (OLED) apparatus and a quantum dot light emitting display (QLED) apparatus have been recently used.

Among the display apparatuses, the organic light emitting display apparatus provided with an organic light emitting element and the quantum dot light emitting display apparatus are self-light emitting types, and have advantages in that a viewing angle and a contrast ratio are more excellent than those of the liquid crystal display (LCD) apparatus. Also, since the organic light emitting display apparatus and the quantum dot light emitting display apparatus do not require a separate backlight, it is advantageous that the display apparatuses are able to be thin and lightweight and have low power consumption.

Meanwhile, an organic light emitting layer included in the organic light emitting element is formed by thermal deposition using a shadow mask.

BRIEF SUMMARY

One of the technical problems that the inventors realized in the related art is the increase in deposition defects in a large-sized display apparatus. In particular, in a large-sized display apparatus, deposition defects are increased due to severe deflection of the shadow mask. In this regard, the inventors have realized that it is becoming increasingly difficult to apply the shadow mask to a large-sized substrate.

One method is to spray or coat a liquid organic light emitting material to an area surrounded by a partition through an inkjet device or a nozzle coating device and harden the liquid organic light emitting material. This method can be part of replacing a thermal deposition process using a shadow mask which was used in the related art to manufacture a large-sized organic light emitting element.

One or more embodiments of the present disclosure addresses one or more technical problems in the related art including the technical problem identified above.

One or more embodiments of the present disclosure provide an alternative method of manufacturing a display apparatus that replaces, for example, the thermal deposition process using a shadow mask and a novel display apparatus that may improve a viewing angle.

In addition to the technical benefits of the present disclosure as mentioned above, additional benefits and features of the present disclosure will be clearly understood by those skilled in the art from the following description of the present disclosure.

One example embodiment of a display apparatus includes a display apparatus comprising a substrate provided with a plurality of subpixels, and a plurality of banks for distinguishing the plurality of subpixels on the substrate, wherein each of the plurality of subpixels includes a main light emitting portion provided between the plurality of banks, and a sub-light emitting portion spaced apart from the main light emitting portion and disposed to be higher than the main light emitting portion.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
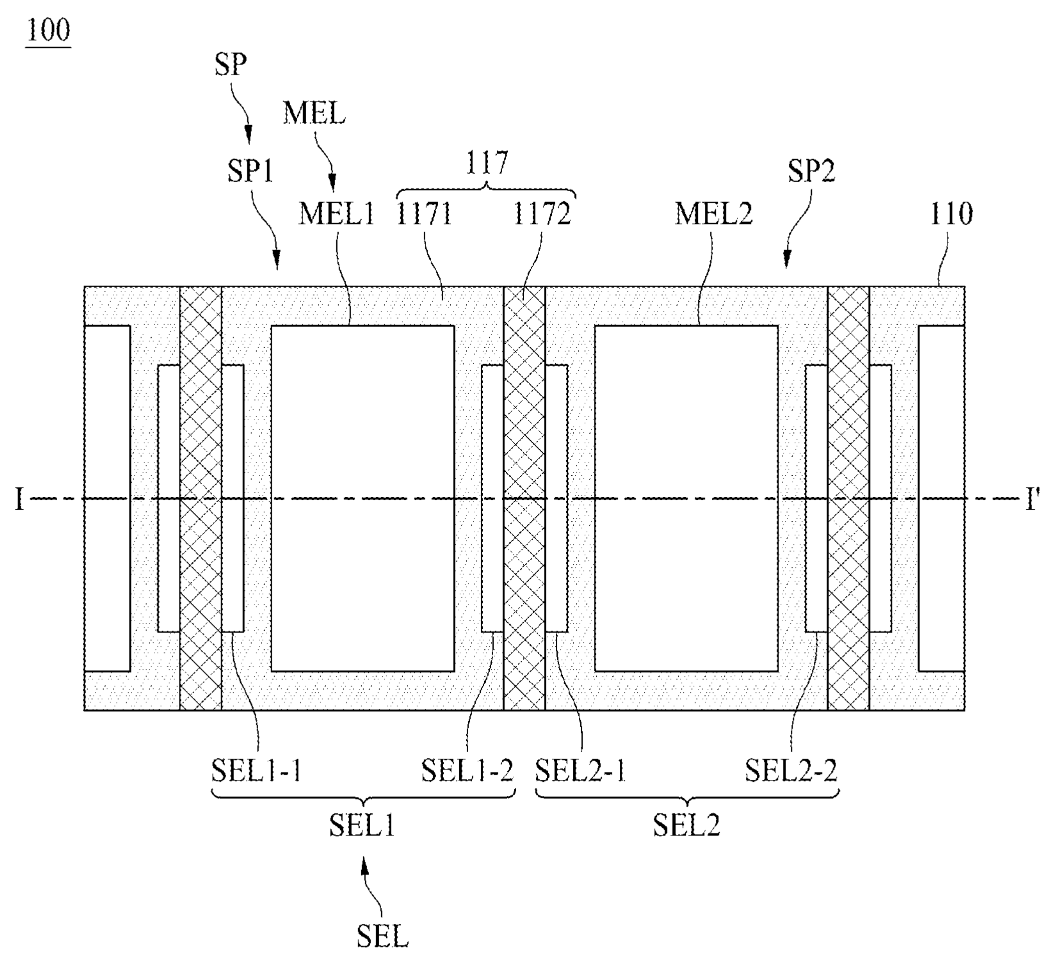
FIG. 1 is a schematic plan view illustrating a display apparatus according to one embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, dimensions (e.g., length, width, height, thickness, radius, diameter, area, etc.), a ratio, an angle, and a number of components, and the like disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location and thickness of the components illustrated in various drawings submitted herewith are part of the present disclosure.

Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction", "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, the example embodiments of the present disclosure will be described in detail with reference to the accompanying drawings.

Figure 2:
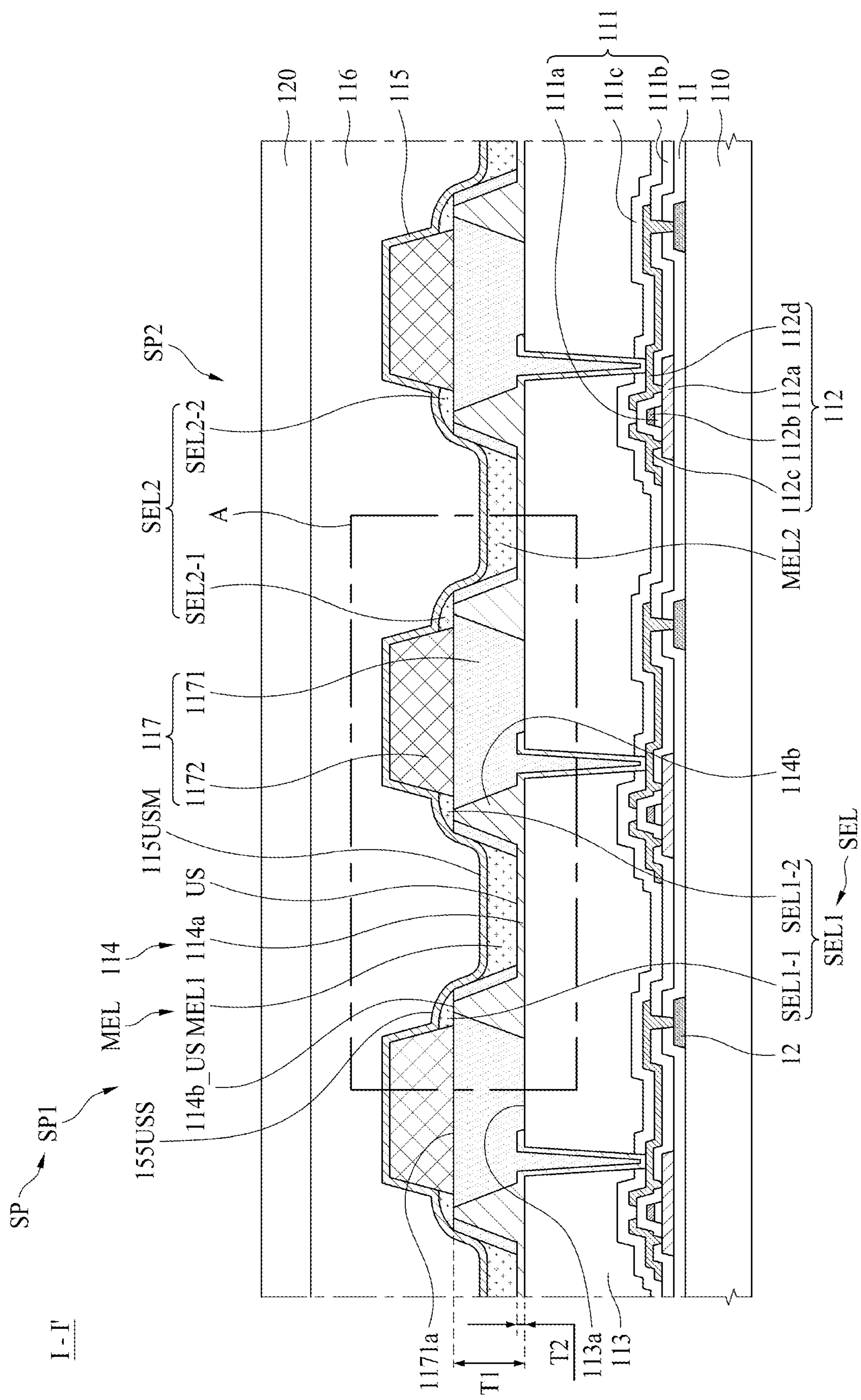
FIG. 2 is a schematic cross-sectional view illustrating line I-I' shown in FIG. 1.
Figure 3:
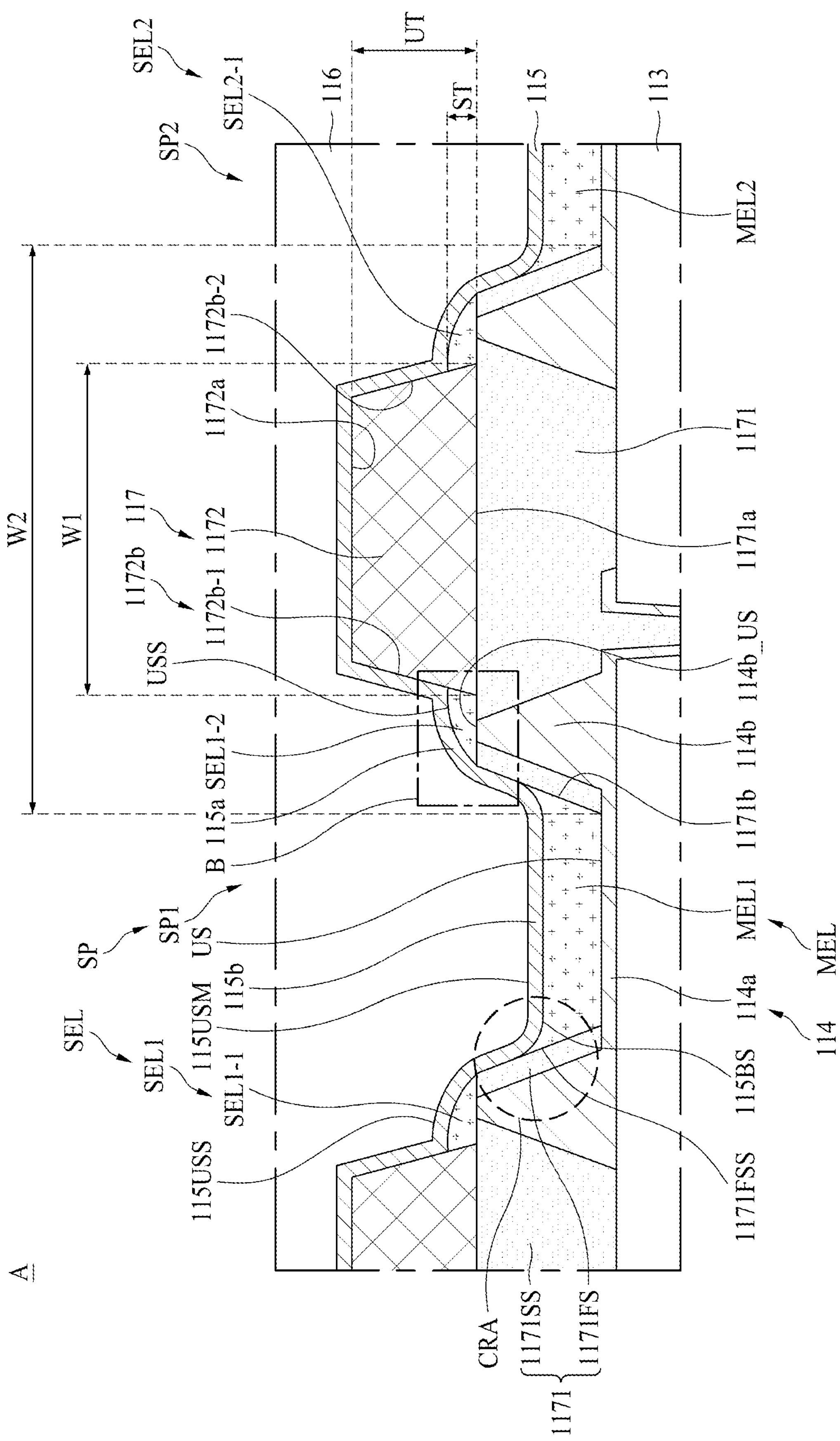
FIG. 3 is an enlarged view illustrating an area A of FIG. 2.
Figure 4:
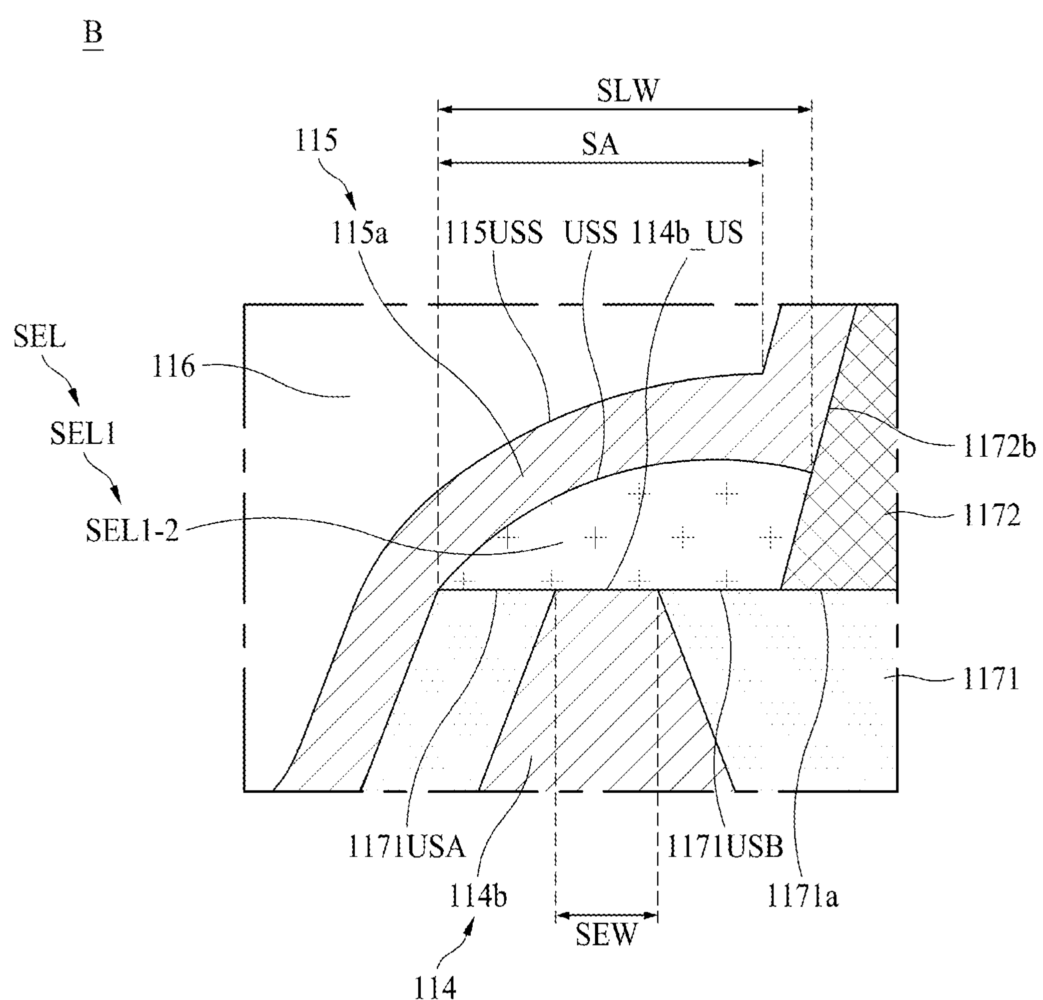
FIG. 4 is an enlarged view illustrating an area B of FIG. 3.

FIG. 1 is a schematic plan view illustrating a display apparatus according to one embodiment of the present disclosure, FIG. 2 is a schematic cross-sectional view illustrating line I-I' shown in FIG. 1, FIG. 3 is an enlarged view illustrating an area A of FIG. 2, and FIG. 4 is an enlarged view illustrating an area B of FIG. 3.

Referring to FIGS. 1 to 4, a display apparatus 100 according to one embodiment of the present disclosure includes a substrate 110 having a plurality of subpixels SP and a plurality of banks 117 for distinguishing the plurality of subpixels SP on the substrate 110. Each of the plurality of subpixels SP may include a main light emitting portion MEL provided between the plurality of banks 117 and a sub-light emitting portion SEL spaced apart from the main light emitting portion MEL and disposed to be higher than the main light emitting portion MEL The sub-light emitting portion SEL according to one example is disposed above each of the plurality of banks 117 so that it may be disposed to be higher than the main light emitting portion MEL. For example, each of the plurality of banks 117 may include a first portion of the bank and a second portion of the bank. The first portion of the bank may refer to a lower bank 1171 partially adjacent to the main light emitting portion MEL and the second portion of the bank may refer to an upper bank 1172 disposed on the lower bank 1171. The sub-light emitting portion SEL may be disposed on the lower bank 1171, and may be in contact with the upper bank 1172 (or sides of the upper bank 1172). Therefore, the sub-light emitting portion SEL may be disposed to be closer to the bank 117 than the main light emitting portion MEL, and may be disposed to be higher than the main light emitting portion MEL as shown in FIGS. 2 and 3.

In case of a general display apparatus, during a solution process of coating liquid organic light emitting materials for emitting different colors to each subpixel, in order to prevent the liquid organic light emitting materials for emitting different colors from being mixed between the subpixels, a bank for distinguishing the subpixels may be provided to be high. For example, the bank may be provided as a double bank of a lower bank and an upper bank on the lower bank. When the height of the bank is high, light emitted from the light emitting portion positioned to be relatively lower than an upper surface of the bank may be partially covered by the bank, so that a viewing angle may be narrowed. In the display apparatus 100 according to one embodiment of the present disclosure, the sub-light emitting portion SEL is provided on the bank, more particularly on an upper surface of the lower bank 1171, whereby a viewing angle may be improved.

In addition, the display apparatus 100 according to one embodiment of the present disclosure may further include a sub-light emitting portion SEL at an edge portion of the subpixel SP separately from the main light emitting portion MEL that is at a central portion of the subpixel SP, thereby improving luminance of each subpixel SP.

Hereinafter, a display apparatus 100 according to one embodiment of the present disclosure will be described in more detail with reference to FIGS. 1 to 4.

Referring to FIG. 2, the substrate 110 includes a thin film transistor, and may be a transistor array substrate, a lower substrate, a base substrate or may simply be referred herein after as a first substrate. In other embodiments, the substrate 110 may be a transparent glass substrate or a transparent plastic substrate. The transparent plastic substrate may be flexible, pliable, or stretchable depending on the specific embodiment. Hereinafter, the substrate 110 will be referred to as the first substrate. An opposite substrate 120 may be provided on the first substrate 110.

The opposite substrate 120 may be bonded to the first substrate 110 via a transparent adhesive member (not shown). For example, the opposite substrate 120 may have a size smaller than that of the first substrate 110, and may be bonded to the other portions except a pad portion of the first substrate 110. The opposite substrate 120 may be an upper substrate, a second substrate or an encapsulation substrate. The opposite substrate 120 may be bonded to a first surface of the first substrate 110 by a substrate bonding process using an adhesive member. Hereinafter, the opposite substrate 120 may be referred to as the second substrate.

The first substrate 110 according to one example may have thereon a plurality of subpixels SP. For example, the first substrate 110 may have thereon a first subpixel SP1 and a second subpixel SP2 adjacent to the first subpixel SP1. The first subpixel SP1 according to one example may be a subpixel for emitting red light, and the second subpixel SP2 may be a subpixel for emitting green light. Each of the plurality of subpixels SP may be defined as an area of a minimum unit, in which light is actually emitted.

The plurality of subpixels SP may further include a third subpixel SP3 (shown in FIG. 5) adjacent to the second subpixel SP2. The third subpixel SP3 according to one example may be a subpixel for emitting blue light. The first subpixel SP1, the second subpixel SP2 and the third subpixel SP3 may constitute one unit pixel P.

Each of the plurality of subpixels SP may include a thin film transistor, and a light emitting element connected to the thin film transistor. The light emitting element may include a light emitting portion interposed between a first electrode and a second electrode. For example, the light emitting portion may include a main light emitting portion MEL and a sub-light emitting portion SEL. Each of the plurality of subpixels SP may include at least one main light emitting portion MEL and at least one sub-light emitting portion SEL. In the present disclosure, each of the subpixels SP includes one main light emitting portion MEL and two sub-light emitting portions SEL1-1 and SEL1-2.

The main light emitting portion MEL and the sub-light emitting portion SEL of each of the plurality of subpixels SP may emit light of the same color. This is because that the main light emitting portion MEL and the sub-light emitting portion SEL are formed together through the same solution process. Since the main light emitting portion MEL and the sub-light emitting portion SEL are formed at their respective positions different from each other but emit light of the same color, the main light emitting portion MEL and the sub-light emitting portion SEL may be included in one subpixel as shown in FIG. 1.

For example, the first subpixel SP1 may include a first main light emitting portion MEL1 and a first sub-light emitting portion SEL1, which are provided to emit red light. The first sub-light emitting portion SEL1 may include a first red sub-light emitting portion SEL1-1 provided at a left upper side of the first main light emitting portion MEL1 and a second red sub-light emitting portion SEL1-2 provided at a right upper side of the first main light emitting portion MEL1, based on FIG. 2. The first red sub-light emitting portion SEL1-1 and the second red sub-light emitting portion SEL1-2 may be disposed opposite of each other at a position that has a height higher than that of the first main light emitting portion MEL1.

The second subpixel SP2 may include a second main light emitting portion MEL2 and a second sub-light emitting portion SEL2, which are provided to emit green light. The second sub-light emitting portion SEL2 may include a first green sub-light emitting portion SEL2-1 provided at a left upper side of the second main light emitting portion MEL2 and a second green sub-light emitting portion SEL2-2 provided at a right upper side of the second main light emitting portion MEL2, based on FIG. 2. The first green sub-light emitting portion SEL2-1 and the second green sub-light emitting portion SEL2-2 may be disposed opposite of each other at a position that has a height higher than that of the second main light emitting portion MEL2. When one pixel P includes a third subpixel SP3 or a third subpixel SP3 and a fourth subpixel, each of the third subpixel SP3 and/or the fourth subpixel may be provided in the same structure as that of the first subpixel SP1 or the second subpixel SP2.

In the display apparatus 100 according to one embodiment of the present disclosure, since one main light emitting portion MEL and two sub-light emitting portions SEL are provided in one subpixel, light emitting efficiency (or luminance) may be improved as compared with the case that only one light emitting portion is provided in the subpixel.

As shown in FIG. 3, since the sub-light emitting portion SEL of each subpixel SP is disposed on an upper surface 1171*a* of the lower bank 1171, the sub-light emitting portion SEL may be positioned to be higher than the main light emitting portion MEL. Further, since the sub-light emitting portion SEL may be positioned to be closer to the upper bank 1172 than the main light emitting portion MEL, a viewing angle may be more improved than the case that there is no light emitting portion on the lower bank.

Referring back to FIG. 2, each of the plurality of subpixels SP may include a buffer layer 11 disposed on the first substrate 110 to prevent moisture permeation to a thin film transistor 112.

In addition, each of the subpixels SP according to one embodiment of the present disclosure may include an inorganic layer 111, which is provided on an upper surface of the buffer layer 11 and includes a gate insulating layer 111*a*, an interlayer insulating layer 111*b* and a passivation layer 111*c*, a planarization layer 113 provided on the inorganic layer 111, a first electrode 114 formed on the planarization layer 113, a bank 117, a main light emitting portion MEL, a sub-light emitting portion SEL, a second electrode 115 and an encapsulation layer 116.

A thin film transistor 112 for driving the subpixel SP may be disposed in the inorganic layer 111. In one embodiment, the inorganic layer 111 may be expressed as a term of a circuit element layer. The buffer layer 11 may be included in the circuit element layer which also includes the inorganic layer 111 including the gate insulating layer 111*a*, the interlayer insulating layer 111*b* and the passivation layer 111*c*. The first electrode 114, the main light emitting portion MEL, the sub-light emitting portion SEL and the second electrode 115 may be included in the light emitting element (or light emitting element layer). The light emitting element layer is disposed on top of the circuit element layer.

The light emitting element may be electrically connected to a signal line 12 provided on the first substrate 110. For example, as shown in FIG. 2, the first electrode 114 may be electrically connected to the signal line 112 and thus connected to the signal line 12 connected to the thin film transistor 112. A source electrode 112*c* or a drain electrode 112*d*, which his included in the thin film transistor 112, may be connected to the signal line 12.

The signal line 12 may be a line for applying a signal or power source for driving each of the plurality of subpixels SP. The signal line 12 according to one example may be a gate line. As shown in FIG. 2, the signal line 12 may be provided between the first substrate 110 and the buffer layer 11, but is not limited thereto. For instance, in another embodiment, the signal line 12 may be disposed in another layer. Each of the plurality of subpixels SP may be driven to emit light in accordance with the signal applied from the signal line 12.

The buffer layer 11 may be formed between the first substrate 110 and the gate insulating layer 111*a* to protect the thin film transistor 112. The buffer layer 11 may be disposed on one surface (or front surface) of the first substrate 110. The buffer layer 11 may serve to prevent a material contained in the first substrate 110 from being diffused into a transistor layer during a high temperature process of a manufacturing process of the thin film transistor. Optionally, the buffer layer 11 may be omitted as the case may be.

The thin film transistor 112 according to an example may include an active layer 112*a*, a gate electrode 112*b*, a source electrode 112*c*, and a drain electrode 112*d*.

The active layer 112*a* may include a channel area, a drain area and a source area, which are formed in a thin film transistor area of a circuit area of the subpixel SP. The drain area and the source area may be spaced apart from each other with the channel area interposed therebetween.

The active layer 112*a* may be formed of a semiconductor material based on any one of amorphous silicon, polycrystalline silicon, oxide and organic material.

The gate insulating layer 111*a* may be formed on the channel area of the active layer 112*a*. As an example, the gate insulating layer 111*a* may be formed in an island shape only on the channel area of the active layer 112*a*, or may be formed on an entire front surface of the first substrate 110 or the buffer layer 11, which includes the active layer 112*a*.

The gate electrode 112*b* may be formed on the gate insulating layer 111*a* to overlap the channel area of the active layer 112*a*.

The interlayer insulating layer 111*b* may be formed on the gate electrode 112*b* and the drain area and the source area of the active layer 112*a*. The interlayer insulating layer 111*b* may be formed in the circuit area and an entire light emission area, in which light is emitted to the subpixel SP. For example, the interlayer insulating layer 111*b* may be made of an inorganic material, but is not necessarily limited thereto.

The source electrode 112*c* may be electrically connected to the source area of the active layer 112*a* through a source contact hole provided in the interlayer insulating layer 111*b* overlapped with the source area of the active layer 112*a*.

The drain electrode 112*d* may be electrically connected to the drain area of the active layer 112*a* through a drain contact hole provided in the interlayer insulating layer 111*b* overlapped with the drain area of the active layer 112*a*.

The drain electrode 112*d* and the source electrode 112*c* may be made of the same metal material. For example, each of the drain electrode 112*d* and the source electrode 112*c* may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Since each of the first and second switching thin film transistors is provided on the circuit area of the subpixel SP to have the same structure as that of the thin film transistor 112, its description will be omitted. The capacitor may be provided in an overlap area between the gate electrode 112*b* and the source electrode 112*c* of the thin film transistor 112, which overlap each other with the interlayer insulating layer 111*b* interposed therebetween.

Additionally, in order to prevent a threshold voltage of the thin film transistor provided in a pixel area from being shifted by light, the first substrate 110 may further include a light shielding layer (not shown) provided below the active layer 112*a* of at least one of the thin film transistor 112, the first switching thin film transistor or the second switching thin film transistor. The light shielding layer may be disposed between the first substrate 110 and the active layer 112*a* to shield light incident on the active layer 112*a* through the first substrate 110, thereby reducing or minimizing a change in the threshold voltage of the transistor due to external light.

The passivation layer 111*c* may be provided on the first substrate 110 to cover the pixel area. The passivation layer 111*c* covers the drain electrode 112*d* and the source electrode 112*c* of the thin film transistor 112 and the interlayer insulating layer 111*b*. The passivation layer 111*c* may be entirely formed in the circuit area and the light emission area. For example, the passivation layer 111*c* may be expressed as a protective layer. The passivation layer 111*c* may be omitted.

The planarization layer 113 may be formed on the first substrate 110 to cover the passivation layer 111*c*. When the passivation layer 111*c* is omitted, the planarization layer 113 may be provided on the first substrate 110 to cover the circuit area. The planarization layer 113 may be formed entirely in the circuit area and the light emission area.

The planarization layer 113 according to an example may be formed to be relatively thick, and thus may provide a flat surface on the display area provided with the plurality of subpixels SP. For example, the planarization layer 113 may be made of an organic material such as photo acryl, benzocyclobutene, polyimide, and fluorine resin.

The first electrode 114 of the subpixel SP may be formed on the planarization layer 113. The first electrode 114 is connected to the drain electrode or the source electrode of the thin film transistor 112 through a contact hole that passes through the planarization layer 113 and the passivation layer 111*c*.

The first electrode 114 may be made of at least one of a transparent metal material, a semi-transmissive metal material, or a metal material having high reflectance.

When the display apparatus 100 is provided in a top emission mode, the first electrode 114 may be formed of a metal material having high reflectance or a stacked structure of a metal material having high reflectance and a transparent metal material. For example, the first electrode 114 may be formed of a metal material having high reflectance, such as a stacked structure (Ti/Al/Ti) of aluminum and titanium, a stacked structure (ITO/Al/ITO) of aluminum and ITO, an Ag alloy, and a stacked structure (ITO/Ag alloy/ITO) of Ag alloy and ITO. The Ag alloy may be an alloy such as silver (Ag), palladium (Pd), and copper (Cu).

When the display apparatus 100 is provided in a bottom emission mode, the first electrode 114 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

Meanwhile, the material constituting the first electrode 114 may include MoTi. The first electrode 114 may be an anode electrode or a pixel electrode.

The first electrode 114 may be partially covered by the lower bank 1171. For example, the lower bank 1171 may cover an edge portion of the first electrode 114. The first electrode 114 that is not covered by the lower bank 1171 may be a light emission area for emitting light. On the other hand, a portion of the first electrode 114, which is covered by the lower bank 1171, may be a non-light emission area for not emitting light. As shown in FIG. 2, a portion of the first electrode 114, for example, a portion of a main electrode 114*a* and a sub-electrode 114*b*, which are included in the first electrode 114, is not covered by the lower bank 1171, and thus may be included in the light emission area. Therefore, the display apparatus 100 according to one embodiment of the present disclosure may include two light emission areas, for example, a main light emission area provided with the main light emitting portion MEL and a sub-light emission area provided with the sub-light emitting portion SEL.

Referring to FIG. 2, the first electrode 114 may include a main electrode 114*a* and a sub-electrode 114*b*.

The main electrode 114*a* may overlap the main light emitting portion MEL below the main light emitting portion MEL. As described above, the first electrode 114 that is not covered by the lower bank 1171 may be the main electrode 114*a*. In other words, the first electrode 114 that does not overlap with the lower bank 1171 from a plan view may be part of the main electrode 114*a*. Since the main light emitting portion MEL is formed on the main electrode 114*a* by a solution process, the main electrode 114*a* may overlap at least a portion of the main light emitting portion MEL.

The sub-electrode 114*b* may be connected to the main electrode 114*a*. Therefore, the sub-electrode 114*b* may receive the same power source (or voltage) as that of the main electrode 114*a*. The sub-light emitting portion SEL may be provided on the sub-electrode 114*b* through the same solution process as that of the main light emitting portion MEL In one embodiment, the sub-electrode 114*b* may be formed together with the main electrode 114*a* in the same formation process. For example, the sub-electrode 114*b* and the main electrode 114*a* may be formed together by photo and etching processes using a half-tone mask or a multi-tone mask after depositing a metal material having a predetermined thickness on the planarization layer 113 having a contact hole. In this case, the main electrode 114*a* and the sub-electrode 114*b* may be provided to have their respective thicknesses different from each other by a half-tone mask or a multi-tone mask.

For example, a thickness T1 of at least a portion of the sub-electrode 114*b* may be thicker than a thickness T2 of the main electrode 114*a*. The thickness T1 of at least a portion of the sub-electrode 114*b* may be measured as a thickness between an upper surface 113*a* of the planarization layer 113 and an upper surface 1171*a* of the lower bank 1171. Thickness may also be referred to as height as appropriate. Thickness T2 of the main electrode 114*a* may be measured as a thickness (or height) between an upper surface 113*a* of the planarization layer 113 and an upper surface US of the main electrode 114*a*. In this case, at least a portion of the sub-electrode 114*b* may refer to the sub-electrode 114*b* that is not covered by the lower bank 1171, as shown in FIG. 2. As at least a portion of the sub-electrode 114*b* is provided to have the thickness T1 thicker than the thickness T2 of the main electrode 114*a*, at least a portion of the sub-electrode 114*b* may be exposed without being covered by the lower bank 1171. That is, as shown in FIG. 2, an upper surface of at least a portion of the sub-electrode 114*b* may be exposed without being covered by the lower bank 1171. Therefore, the sub-electrode 114*b* that is not covered by the lower bank 1171 may function as an anode for emitting the sub-light emitting portion SEL. That is, the sub-electrode 114*b* that is not covered by the lower bank 1171 may form an electric field together with the second electrode 115*a* provided on the sub-light emitting portion SEL, thereby allowing the sub-light emitting portion SEL to emit light.

Likewise, the main electrode 114*a*, which is not covered by the lower bank 1171, may form an electric field together with the second electrode 115*b* provided on the main light emitting portion MEL, thereby allowing the main light emitting portion MEL to emit light. Since the main electrode 114*a* and the sub-electrode 114*b* receive the same voltage (or power source) at the same time, the main light emitting portion MEL and the sub-light emitting portion SEL may emit light at the same time.

The bank 117 is a non-light emission area for not emitting light, and may be provided to surround each of light emission areas (or light emitting portions) of each of the plurality of subpixels SP. That is, the bank 117 may distinguish (or define) each of the light emission areas (or light emitting portions). Since the bank 117 according to one example distinguishes the plurality of subpixels SP, a plurality of banks 117 may be provided on the first substrate 110.

The bank 117 may be formed on the planarization layer 113 to cover a portion of an edge of the first electrode 114, for example, a portion of the sub-electrode 114*b*, thereby distinguishing (or defining) the light emission areas (or light emitting portions) of each of the plurality of subpixels SP. The bank 117 may be formed to cover an edge (or a portion of the sub-electrode 114*b*) of the first electrode 114 of each of the subpixels SP and expose a portion of the first electrode 114 (or main electrode 114*a*). Therefore, the bank 117 may prevent light emitting efficiency from being deteriorated due to a current concentrated on each end of the first electrode 114. Alternatively, the bank 117 may prevent the first electrode 114 and the second electrode 115 from being short-circuited due to a thin thickness of the light emitting portion at each end of the first electrode 114.

The bank 117 according to one example may include a lower bank 1171 and an upper bank 1172. While the lower bank 1171 and the upper bank 1172 may be collectively referred to as the bank 117, in one embodiment, the lower bank 1171 and the upper bank 1172 may be different structures made of different materials in a different formation process. For instance, the lower bank 1171 may be made of a material having a relatively high surface energy and the upper bank 1172 may be made of a material having a relatively low surface energy compared to the lower bank 1171. The upper bank 1172 may be disposed on the lower bank 1171. As shown in FIGS. 2 and 3, the upper bank 1172 may be disposed to be spaced apart from the main light emitting portion MEL. This is to dispose the sub-light emitting portion SEL between the main light emitting portion MEL and the upper bank 1172. This will be described below with reference to FIG. 4.

The lower bank 1171 according to one example of the present disclosure may include an upper surface 1171*a* and an inclined surface 1171*b* connected to the upper surface 1171*a*. The upper bank 1172 may include an upper surface 1172*a* and an inclined surface 1172*b* connected to the upper surface 1172*a*. As shown in FIG. 3, the inclined surface 1172*b* of the upper bank 1172 may include a left inclined surface 1172*b*-1 and a right inclined surface 1172*b*-2.

The lower bank 1171 may be partially adjacent to the main light emitting portion MEL on the first substrate 110. For example, a portion of the inclined surface 1171*b* (shown in FIG. 3) of the lower bank 1171 may be adjacent to (or in contact with) the main light emitting portion MEL.

A width W1 of the upper bank 1172 may be provided to be narrower than a width W2 of the lower bank 1171. This is to make sure of an area (or sub-area SA, shown in FIG. 4) in which the sub-light emitting portion SEL may be disposed on the lower bank 1171. As described above, as the width W1 of the upper bank 1172 is narrower than the width W2 of the lower bank 1171, a predetermined area (or sub-area SA) may be formed between the inclined surface 1172*b* of the upper bank 1172 and the inclined surface 1171*b* of the lower bank 1171. Therefore, the sub-light emitting portion SEL may be formed in the sub-area SA by a subsequent solution process. The sub-light emitting portion SEL formed in the sub-area SA may be in contact with the upper bank 1172 (or the inclined surface 1172*b* of the upper bank 1172) on the lower bank 1171.

The lower bank 1171 may be made of a material having a relatively high surface energy so as to lower a contact angle with a light emitting layer material constituting the main light emitting portion EL formed later, and the upper bank 1172 may be made of a material having a relatively low surface energy so as to increase a contact angle with a light emitting layer material constituting the sub-light emitting portion SEL formed later, thereby preventing the light emitting layer material from overflowing to the subpixel adjacent thereto.

For example, the lower bank 1171 may be made of an inorganic insulating material or an organic insulating material, which has hydrophilic properties, and the upper bank 1172 may be made of an organic insulating material having hydrophobic properties. For example, each of the lower bank 1171 and the upper bank 1172 may be formed of an organic layer such as an acrylic resin, an epoxy resin, a phenolic resin, a polyamide resin and a polyimide resin, but is not limited thereto.

The upper surface 1172*a* of the upper bank 1172 may be provided to be higher than an upper surface USS of the sub-light emitting portion SEL. In more detail, the upper surface 1172*a* of the upper bank 1172 may be provided to be higher than the highest portion of the upper surface USS of the sub-light emitting portion SEL. This may be accomplished in such a manner that a thickness UT of the upper bank 1172 is thicker than a thickness ST of the sub-light emitting portion SEL. The thickness UT of the upper bank 1172 may be measured as a thickness between the upper surface 1172*a* of the upper bank 1172 and the upper surface 1171*a* of the lower bank 1171. The thickness ST of the sub-light emitting portion SEL may be measured as a thickness (or height) between the highest portion of the upper surface USS of the sub-light emitting portion SEL and the upper surface 1171*a* of the lower bank 1171. As the thickness UT of the upper bank 1172 is thicker than the thickness ST of the sub-light emitting portion SEL, the light emitting layer material may be prevented from overflowing to the subpixel adjacent thereto.

Referring back to FIGS. 2 and 3, the light emitting portion is formed on the first electrode 114 and the lower bank 1171. In more detail, the main light emitting portion MEL is formed on the main electrode 114*a*, and the sub-light emitting portion SEL is formed on a portion of the upper surface of the lower bank 1171. The sub-light emitting portion SEL formed on the lower bank 1171 may be in contact with the sub-electrode 114*b* exposed without being covered by the lower bank 1171. The width of the sub-light emitting portion SEL formed on the lower bank 1171 that is in contact with the sub-electrode 114*b* without being covered by the lower bank 1171 is referred to as width SEW (see FIG. 4).

The main light emitting portion MEL and the sub-light emitting portion SEL may be formed together by the same solution process, but are not limited thereto. The main light emitting portion MEL and the sub-light emitting portion SEL may be formed at their respective positions different from each other by a separate solution process. For example, the main light emitting portion MEL may be formed on the main electrode 114*a*, and the sub-light emitting portion SEL may be formed on the sub-electrode 114*b* that is not covered by the lower bank 1171.

The main light emitting portion MEL may emit light when a voltage is applied to the main electrode 114*a* and the second electrode 115 (or 115*b*). The sub-light emitting portion SEL may emit light when a voltage is applied to the sub-electrode 114*b* and the second electrode 115 (or 115*a*).

Since the main light emitting portion MEL and the sub-light emitting portion SEL may be formed together through the same process, the main light emitting portion MEL and the sub-light emitting portion SEL may be provided in the same structure. For example, each of the main light emitting portion MEL and the sub-light emitting portion SEL may include a hole transporting layer HTL, at least one light emitting layer and an electron transporting layer ETL. When a high potential voltage is applied to the first electrode 114 and a low potential voltage is applied to the second electrode 115, holes and electrons are moved to the light emitting layer through the hole transporting layer and the electron transporting layer, respectively, and are combined with each other in the light emitting layer to emit light. Light of different colors, such as red light, green light, blue light and white light, may be emitted depending on the material constituting the light emitting layer.

For example, in the first subpixel SP1, as the light emitting layer is made of a material for emitting red light, red light may be emitted from each of the main light emitting portion MEL and the sub-light emitting portion SEL when an electric field of the first electrode 114 and the second electrode 115 is formed. In the second subpixel SP2, as the light emitting layer is made of a material for emitting green light, green light may be emitted from each of the main light emitting portion MEL and the sub-light emitting portion SEL when an electric field of the first electrode 114 and the second electrode 115 is formed.

The second electrode 115 is formed on the light emitting portion and the bank 117. The second electrode 115 may be a common layer commonly formed in the subpixels SP. In one embodiment, the second electrode 115 may be continuously connected and covers the main light emitting portion MEL, the sub-light emitting portion SEL, the lower bank 1171, and the upper bank 1172 as shown in FIG. 2. Further, as illustrated, the second electrode 115 continuously extends between at least two adjacent subpixels SP1 and SP2. While not illustrated in FIG. 2 for brevity purposes, in some embodiments, the second electrode may continuously and contiguously extend to subpixels adjacent to SP1 and subpixels adjacent to SP2 (see FIG. 5). In another embodiment, where the dam DAM is disposed on the lower bank 1171, the second electrode 115 may be continuously and contiguously connected and covers the main light emitting portion MEL, the sub-light emitting portion SEL, the lower bank 1171, the dam DAM, and the upper bank 1172 as shown in FIG. 6.

The second electrode 115 may be made of a transparent conductive material, a semi-transmissive conductive material or a conductive material having high reflectance.

When the display apparatus 100 is provided in a top emission mode, the second electrode 115 may be formed of a transparent conductive material such as ITO and IZO, which may transmit light, or a semi-transmissive conductive material such as magnesium (Mg), silver (Ag) or an alloy of magnesium (Mg) and silver (Ag).

When the display apparatus 100 is provided in a bottom emission mode, the second electrode 115 may be formed of a conductive material having high reflectance, such as a stacked structure (Ti/Al/Ti) of aluminum and titanium, a stacked structure (ITO/Al/ITO) of aluminum and ITO, Ag alloy and a stacked structure (ITO/Ag alloy/ITO) of Ag alloy and ITO. The Ag alloy may be an alloy such as silver (Ag), palladium (Pd), copper (Cu), etc. The second electrode 115 may be an opposite electrode or a cathode electrode.

In FIG. 3, a curvature area CRA is shown in FIG. 3. Here, as the second electrode 115 extends down from the sub-light emitting portion SEL (specifically, SEL1-1) towards the main light emitting portion MEL (specifically, MEL1), a side surface 1171FSS of the first section 1171FS of the lower bank layer 1171 and a bottom surface 115BS of the second electrode 115 contact and face each other in the upper portion of the first section 1171FS of the lower bank layer 1171 in the curvature area CRA. As the second electrode 115 further extends down towards the main light emitting portion MEL (specifically, MEL1), the bottom surface 115BS of the second electrode 115 gradually spaces apart from the side surface 1171FSS of the first section 1171FS of the lower bank layer 1171. That is, the distance between the side surface 1171FSS of the first section 1171FS of the lower bank layer 1171 and the bottom surface 115B S of the second electrode 115 gradually increases from the upper portion of the curvature area CRA to the lower portion curvature area CRA.

The second electrode 115 extends across the main light emitting portion MEL and further covers the upper surface USS of the sub-light emitting portion SEL. As shown in FIGS. 3 and 4, the upper surface USS of the sub-light emitting portion SEL contacts and faces the bottom surface 115BS of the second electrode 115. Further, as shown in FIG. 4, due to the different properties of the materials used between sub-light emitting portion SEL and the upper bank 1172, the sub-light emitting portion SEL protrudes upwardly in a central portion of the sub-light emitting portion SEL. Differently put, the upper surface USS of the sub-light emitting portion SEL will be thickest (or highest) in the central portion of the sub-light emitting portion SEL (similar to the SEL1-2 shown in FIG. 7). For example, the sub-light emitting portion SEL has a thickness that gradually increases and after passing the thickest point in the central portion, the thickness of the sub-light emitting portion SEL then gradually decreases as the sub-light emitting portion SEL approaches a second bank layer 1172 disposed on the second section 1171SS of the first bank layer 1171.

The encapsulation layer 116 may be formed on the second electrode 115. The encapsulation layer 116 serves to prevent oxygen or moisture from being permeated into the light emitting portion, that is, the main light emitting portion MEL, the sub-light emitting portion SEL and the second electrode 115. Accordingly, in some embodiments, the encapsulation layer 116 may include at least one inorganic layer and at least one organic layer. The second substrate 120 may be provided on the encapsulation layer 116.

Referring to FIG. 2, the second electrode 115 is provided as a common layer, so that the second electrode 115 may cover the main light emitting portion MEL, the sub-light emitting portion SEL, the lower bank 1171 and the upper bank 1172. The second electrode 115 may include a first portion 115*b* that overlaps the main light emitting portion MEL, and a second portion 115*a* that overlaps the sub-light emitting portion SEL.

The main light emitting portion MEL may emit light as an electric field is formed in the first portion 115*b* and the main electrode 114*a*. The sub-light emitting portion SEL may emit light as an electric field is formed in the second portion 115*a* and the sub-electrode 114*b*.

Referring to FIGS. 2 and 3, the first electrode 114 has at least two portions to it. The first portion is the main electrode 114*a*. The first portion includes a strip shape or a rectangular shape cross-section as seen from the figures. The second portion is the sub-electrode 114*b* that has a trapezoid-like cross-section. In the figures, there are two second portions each one on each side of the first portion and in one embodiment, the second portion is continuous and contiguous to the first portion. The second portion of the first electrode 114 is on an upper surface of the first substrate 110. The second portion of the first electrode 114 extends upwards or protrudes upwards in a direction opposite of the upper surface of the first substrate 110. In the figures, the second portion of the first electrode 114 protrudes upward sufficiently that an upper surface 114*b* US of the second portion of the first electrode is higher than an upper surface US of the first portion of the first electrode 114.

As shown in FIGS. 2, 3, and 4, the lower bank layer 1171 is disposed on both adjacent sides of the second portion 114*b* of the first electrode 114. That is, a first section 1171FS of the lower bank layer 1171 is on one adjacent side (e.g., the relatively small strip piece of the lower bank layer 1171 that is disposed between 114*b* and 115) of the second portion of the first electrode. A second section 1171SS of the lower bank layer 1171 is on an opposite adjacent side of the second portion of the first electrode (e.g., the trapezoid shaped cross-section portion). Here, the first section 1171FS of the lower bank layer 1171 is disposed on and contacts both the first and second portions of the first electrode 114*a* and 114*b*. In addition, the first section 1171FS of the lower bank layer 1171 contacts the second electrode 115 and the main light emitting portion MEL.

Referring to FIGS. 3 and 4, the sub-light emitting portion SEL may be disposed between the second electrode 115 covering the lower bank 1171 and the sub-electrode 114*b*. That is, the sub-light emitting portion SEL may be disposed between the second portion 115*a* of the second electrode 115 and the sub-electrode 114*b*. As the sub-light emitting portion SEL is disposed between the second portion 115*a* and the sub-electrode 114*b*, a contact between the second portion 115*a* and the sub-electrode 114*b* may be avoided, whereby a short circuit may be prevented from occurring.

Referring to FIGS. 3 and 4, the lower bank 1171 may include a sub-area SA between the main light emitting portion MEL and the upper bank 1172. The sub-area SA may be provided on the upper surface 1171*a* of the lower bank 1171 in accordance with a width difference between the upper bank 1172 and the lower bank 1171. At least a portion of the sub-electrode 114*b* may be exposed from the sub-area SA, and the exposed sub-electrode 114*b* may be in contact with a lower surface of the sub-light emitting portion SEL. In addition, the second electrode 115 (or the second portion 115*a*) may be in contact with an upper surface of the sub-light emitting portion SEL by a subsequent process.

Referring to FIG. 4, a width SLW of the sub-light emitting portion SEL may be wider than a width SEW of the sub-electrode 114*b* exposed from the sub-area SA. Therefore, the sub-light emitting portion SEL may cover the entire sub-electrode 114*b* exposed without being covered by the lower bank 1171. Therefore, the sub-light emitting portion SEL may have a function of preventing the contact between the sub-electrode 114*b* and the second electrode 115 (or the second portion 115*a*).

As illustrated in FIG. 4, the lower bank 1171 has two portions that directly contact the sub-light emitting portion SEL. More specifically, an upper surface 1171USA of a first portion of the lower bank 1171 contacts the second red sub-emitting portion SEL1-2 and an upper surface 1171USB of a second portion of the lower bank 1171 also contacts the second red sub-emitting portion SEL1-2. The sub-electrode 114*b* is exposed between the upper surface 1171USA of a first portion of the lower bank 1171 and the upper surface 1171USB of a second portion of the lower bank 1171. The exposed upper surface of the sub-electrode 114*b* is flush with (or coplanar with) the upper surface 1171USA of a first portion of the lower bank 1171 and the upper surface 1171USB of a second portion of the lower bank 1171. The exposed upper surface of the sub-electrode 114*b* has a width SEW.

In one embodiment, the sub-electrode 114*b* extends between the first portion of the lower bank 1171 and the second portion of the lower bank 1171. Accordingly, the sub-electrode 114*b* includes a trapezoid-like cross-section between the first portion of the lower bank 1171 and the second portion of the lower bank 1171. The upper surface of trapezoid-like shape of the sub-electrode 114*b* (i.e., exposed upper surface of the sub-electrode 114*b*) may function as an anode, so that an electric field may be formed between the sub-electrode 114*b* and the second electrode 115 (more specifically, 115*a*).

In one embodiment, an upper surface 115USM of the second electrode 115 in a location overlapping the main light emitting portion MEL is lower than an upper surface 115USS of the second electrode in a location overlapping the sub-light emitting portion SEL as illustrated in FIGS. 2 and 3.

Referring back to FIG. 3, the upper bank 1172 may not overlap or may partially overlap the sub-electrode 114*b*, which is exposed from the sub-area SA, in a thickness direction of the first substrate 110. This is to make sure of the sub-area SA for forming the sub-light emitting portion SEL on the upper surface of the lower bank 1171.

For example, when the upper bank 1172 overlaps only a portion of the sub-electrode 114*b* exposed without being covered by the lower bank 1171, the sub-area SA may be formed between the inclined surface 1172*b* of the upper bank 1172 and the inclined surface 1171*b* of the lower bank 1171, so that the sub-light emitting portion SEL may be formed in the sub-area SA by a subsequent process. However, since the upper bank 1172 covers a portion of the upper surface of the sub-electrode 114*b*, a contact area (or size of the sub-area SA) between the upper surface of the sub-electrode 114*b*, which is not covered by the upper bank 1172, and the sub-light emitting portion SEL becomes smaller, whereby light emitting efficiency may be lowered.

When the upper bank 1172 does not overlap the sub-electrode 114*b* that is exposed without being covered by the lower bank 1171, a size of the sub-area SA formed between the inclined surface 1172*b* of the upper bank 1172 and the inclined surface 1171*b* of the lower bank 1171 may become larger than the above-described case, so that the sub-light emitting portion SEL may be better formed in the sub-area SA by a subsequent process. As described above, since the sub-light emitting portion SEL is formed by a solution process, when the size (or width) of the sub-area SA becomes wider, the material constituting the sub-light emitting portion SEL may be well formed in the sub-area SA without flowing toward the main light emitting portion MEL.

Also, when the upper bank 1172 does not overlap the sub-electrode 114*b* that is exposed without being covered by the lower bank 1171, the exposed sub-electrode 114*b* may function as an anode, so that an electric field between the sub-electrode 114*b* and the second electrode 115 may be better formed than the case that the upper electrode 1172 partially overlaps the sub-electrode 114*b*.

Additionally, when the upper bank 1172 does not overlap the exposed sub-electrode 114*b*, a width SA of the sub-area SA may be increased as compared with the case that the upper bank 1172 partially overlaps the sub-electrode 114*b*. As a result, since the width SLW of the sub-light emitting portion SEL may be further increased, light emitting efficiency may be further improved.

Referring back to FIG. 2, in the display apparatus 100 according to one embodiment of the present disclosure, the plurality of banks 117 may include a first bank for distinguishing the first subpixel SP1 from the second subpixel SP2. Since the first bank is one of the plurality of banks, the first bank may be denoted by a reference numeral 117. The first bank 117 may include a lower bank 1171 partially adjacent to the first main light emitting portion MEL1 and the second main light emitting portion MEL2, and an upper bank 1172 disposed on the lower bank 1171.

The sub-light emitting portion SEL may include a first sub-light emitting portion SEL1 spaced apart from the first main light emitting portion MEL1 and disposed to be higher than the first main light emitting portion MEL1, and a second sub-light emitting portion SEL2 spaced apart from the second main light emitting portion MEL2 and disposed to be higher than the second main light emitting portion MEL2.

In this case, the first sub-light emitting portion SEL1 may be in contact with one side of the upper bank 1172 on the lower bank 1171. In more detail, referring to FIG. 3, the second red sub-emitting portion SEL1-2 may be in contact with a portion of the left inclined surface 1172*b*-1 of the upper bank 1172 on the upper surface 1171*a* of the lower bank 1171 and the exposed sub-electrode 114*b*.

The second sub-light emitting portion SEL2 may be in contact with the other side of the upper bank 1172 on the lower bank 1171. In more detail, referring to FIG. 3, the first green sub-light emitting portion SEL2-1 may be in contact with a portion of the right inclined surface 1172*b*-2 of the upper bank 1172 on the upper surface 1171*a* of the lower bank 1171 and the exposed sub-electrode 114*b*.

As a result, the display apparatus 100 according to one embodiment of the present disclosure may further include a sub-light emitting portion SEL on the lower bank 1171, thereby improving a viewing angle without deterioration of front luminance due to the main light emitting portion MEL.

Also, the display apparatus 100 according to one embodiment of the present disclosure may further include a sub-light emitting portion SEL in each of the plurality of subpixels SP separately from the main light emitting portion MEL, thereby improving luminance.

Meanwhile, in the display apparatus 100 according to one embodiment of the present disclosure, the first sub-light emitting portion SEL1 and the second sub-light emitting portion SEL2 may be disposed on both sides based on the upper bank 1172, and may have structural features configured to emit light of different colors. In this case, each of the first sub-light emitting portion SEL1 and the second sub-light emitting portion SEL2 may be provided on a portion of the upper surface of the lower bank 1171, and the first sub-light emitting portion SEL1 may be in contact with the sub-electrode 114*b* of the first subpixel SP1 and the second sub-light emitting portion SEL2 may be in contact with the sub-electrode 114*b* of the second subpixel SP2.

Figure 5:
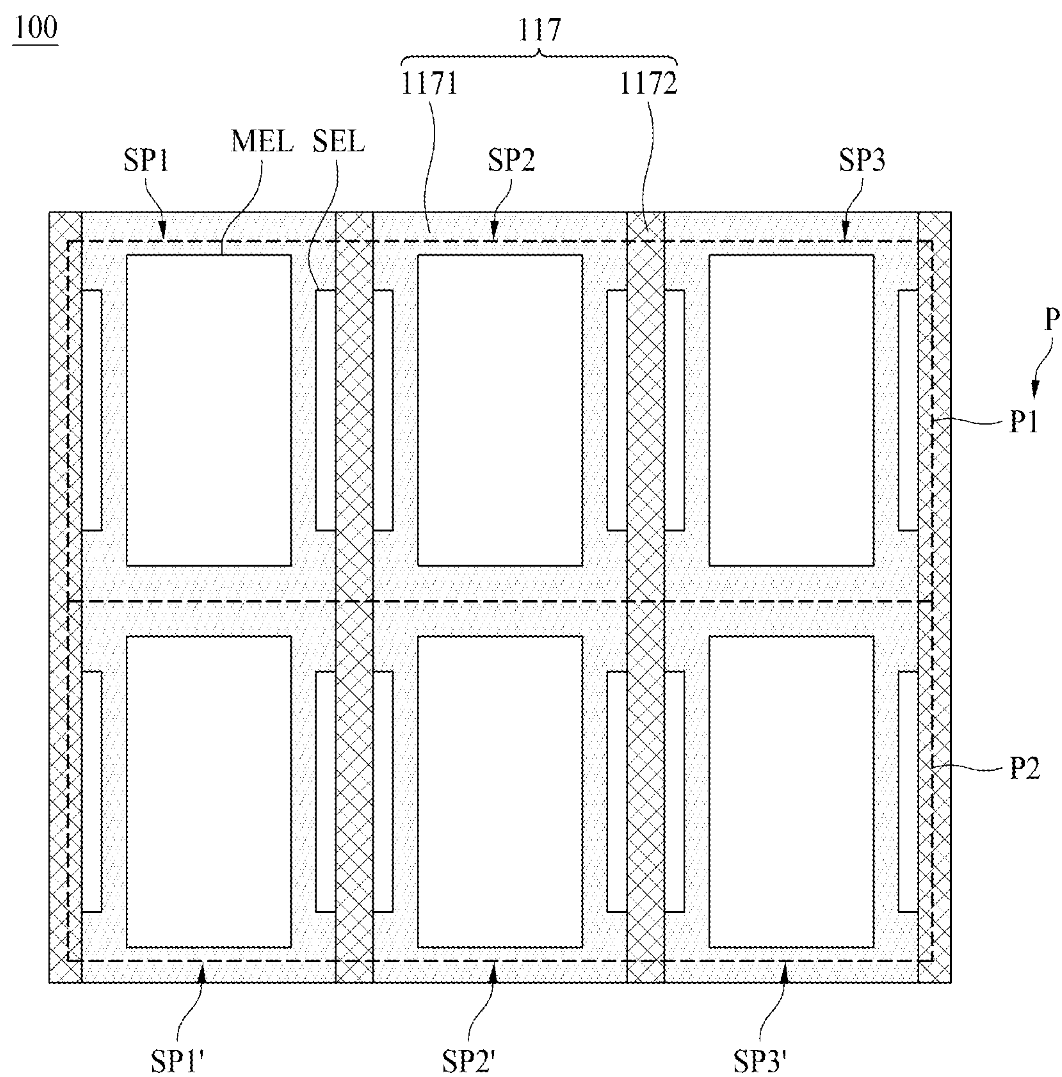
FIG. 5 is a schematic plan view illustrating a plurality of pixels in a display apparatus according to one embodiment of the present disclosure.
Figure 6:
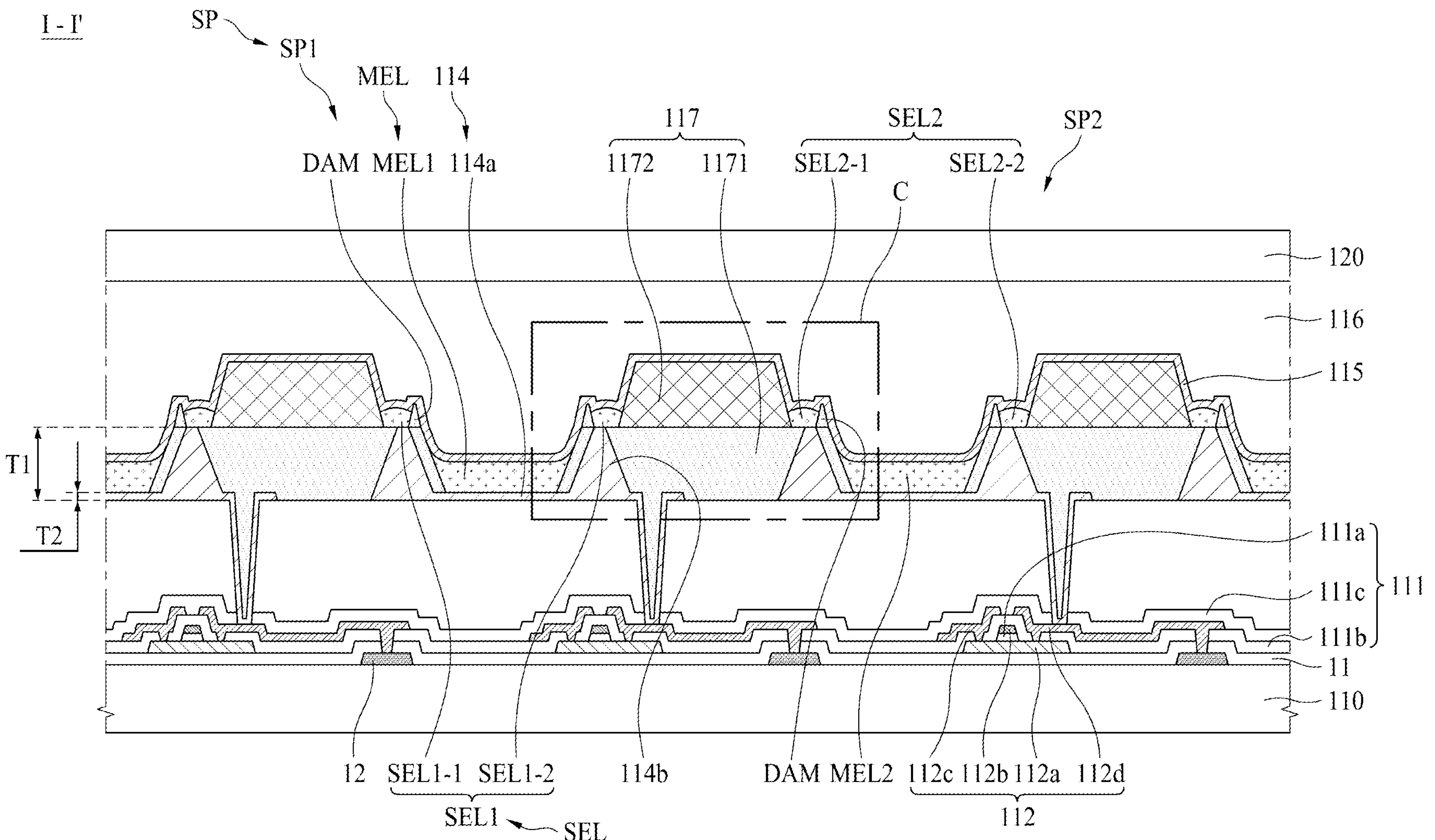
FIG. 6 is a schematic cross-sectional view illustrating a display apparatus according to another embodiment of the present disclosure.

FIG. 5 is a schematic plan view illustrating a plurality of pixels in a display apparatus according to one embodiment of the present disclosure.

Referring to FIG. 5, the plurality of pixels P may be provided on the first substrate 110. As described above, each of the pixels P may include a subpixel provided to emit red light, a subpixel provided to emit green light, and a subpixel provided to emit blue light. For example, a first pixel P1 may include a first subpixel SP1 provided to emit red light, a second subpixel SP2 provided to emit green light, and a third subpixel SP3 provided to emit blue light. A second pixel P2 may include a first subpixel SP1' provided to emit red light, a second subpixel SP2' provided to emit green light, and a third subpixel SP3' provided to emit blue light.

The second pixel P2 may be disposed to be adjacent to the first pixel P1 in a horizontal direction and/or a vertical direction. For example, as shown in FIG. 5, the second pixel P2 may be disposed to be adjacent to the first pixel P1 in a vertical direction. Since the plurality of pixels P are provided on the first substrate 110, as shown in FIG. 5, the plurality of pixels P may be disposed to be adjacent to each other in a vertical direction. In the display apparatus 100 according to one embodiment of the present disclosure, the lower bank 1171 may be provided in a lattice shape, and the upper bank 1172 may be provided in a stripe shape. The lower bank 1171 may be formed in a lattice shape to cover the edge of the first electrode 114 of each of the plurality of subpixels SP.

In contrast, the upper bank 1172 may be disposed over an entire boundary portion of the subpixels SP so that the main light emitting portion MEL and/or the sub-light emitting portion SEL, which includes the light emitting layers of different colors, may be prevented from being mixed with each other between the subpixels SP. Therefore, since the upper bank 1172 of the first pixel P1 and the upper bank 1172 of the second pixel P2 may be connected to each other, as shown in FIG. 5, the upper bank 1172 may be provided in a stripe shape of a vertical direction. The vertical direction may be a direction parallel with a long side direction of the sub-light emitting portion SEL based on FIG. 5, but is not limited thereto. When the sub-light emitting portions SEL of the subpixels SP are not mixed with each other, the upper bank 1172 may be provided in a stripe shape of a horizontal direction. However, even in this case, the sub-light emitting portions SEL of the subpixels SP may be disposed to be adjacent to each other at both sides of the upper bank 1172 of a stripe shape.

Figure 7:
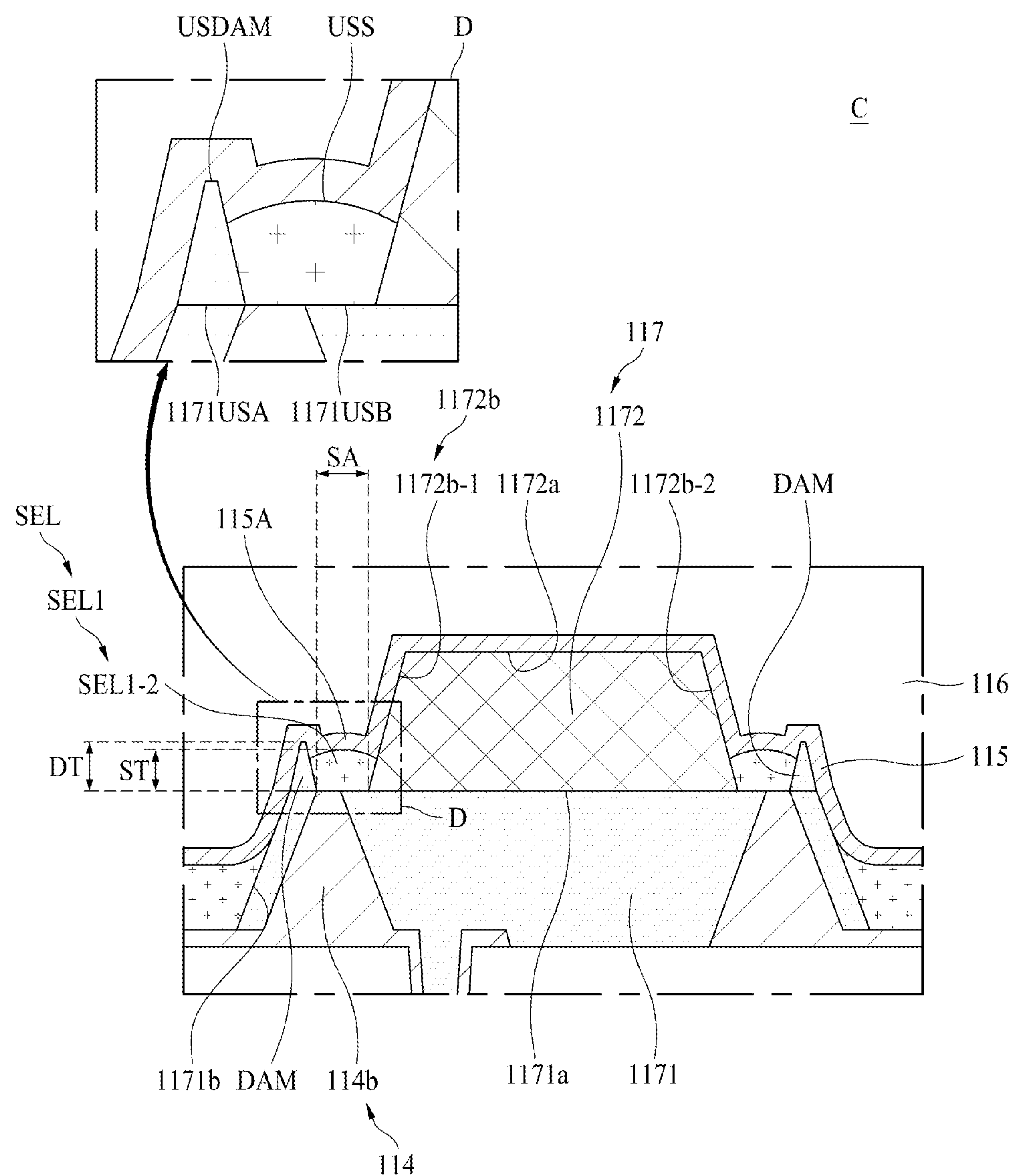
FIG. 7 is an enlarged view illustrating an area C of FIG. 6.

FIG. 6 is a schematic cross-sectional view illustrating a display apparatus according to another embodiment of the present disclosure, and FIG. 7 is an enlarged view illustrating an area C of FIG. 6. FIG. 7 also shows an enlarged view of area D.

Referring to FIGS. 6 and 7, the display apparatus 100 according to another embodiment of the present disclosure is the same as the display apparatus of FIG. 1 except that the lower bank 1171 further includes a dam DAM (or a dam layer DAM). Therefore, the same reference numerals are given to the same elements, and the following description will be based on a difference from the display apparatus of FIG. 1.

In order to form the sub-light emitting portion SEL on the lower bank 1171, the display apparatus according to FIG. 1 includes the sub-area SA by forming the width of the upper bank 1172 to be narrower than the width of the lower bank 1171. Therefore, a solution material of the sub-light emitting portion SEL coated on the sub-area SA may remain in the sub-area SA without fully flowing toward the main light emitting portion MEL, and thus the sub-light emitting portion SEL may be formed in the sub-area SA.

In contrast, in case of the display apparatus according to FIG. 6, the lower bank 1171 may be provided to include a dam DAM spaced apart from the upper bank 1172 and protruded upwardly.

As illustrated in FIG. 7 and the enlarged view of area D, the dam DAM may be disposed on the upper surface 1171USA of the first portion of the lower bank 1171. The dam DAM may be formed to sufficiently cover more than the upper surface 1171USA of the first portion of the lower bank 1171. That is, in some cases, the dam DAM may partially overlap the exposed upper surface of the sub-electrode 114*b* or partially overlap an inclined surface 1171*b* of the lower bank 1171. In other embodiments, the dam DAM may be formed to only cover a portion of the upper surface 1171USA of the first portion of the lower bank 1171 and may not fully cover the upper surface 1171USA of the first portion of the lower bank 1171. While the example drawings in FIG. 7 illustrate a lower surface of the dam DAM having a same width as that of the upper surface 1171USA of the first portion of the lower bank 1171, the embodiments of the present disclosure is not limited to the one illustrated in FIG. 7.

As shown in FIGS. 6 and 7, the dam DAM according to one example may be provided at the edge of the upper surface 1171*a* of the lower bank 1171. The dam DAM may be formed together with the lower bank 1171, or may be formed separately at the edge of the upper surface 1171*a* of the lower bank 1171 after the lower bank 1171 is formed. When the dam DAM is formed separately from the lower bank 1171, as shown in FIG. 6, an inclined surface of the dam DAM may not be matched with the inclined surface 1171*b* of the lower bank 1171. In this case, the dam DAM may be made of a material same or different from that of the lower bank 1171. For example, when the dam DAM is made of a material different from that of the lower bank 1171, the lower bank 1171 may be made of a material having hydrophilic properties, and the dam DAM may be made of a material having hydrophobic properties. In this case, the dam DAM may be formed together with the upper bank 1172 through the same process.

When the dam DAM is formed together with the lower bank 1171, the inclined surface of the dam DAM may be provided to be matched with the inclined surface 1171*b* of the lower bank 1171. In more detail, after the first electrode 114 is formed and then a material constituting the lower bank 1171 is deposited, a photo process and an etching process are sequentially performed using a half-tone mask or a multi-tone mask, whereby the dam DAM may be formed together with the lower bank 1171. In this case, the dam DAM may be made of the same material as that of the lower bank 1171, and may be provided so that the inclined surface of the dam DAM may be matched with the inclined surface 1171*b* of the lower bank 1171.

As shown in FIG. 6, the dam DAM is formed at the edge of the upper surface 1171*a* of the lower bank 1171, whereby the sub-area SA may be formed between the dam DAM and the upper bank 1172. When a solution material (or liquid organic light emitting material) constituting the sub-light emitting portion SEL is coated on the sub-area SA, the upper bank 1172 and the dam DAM may trap the solution material. Therefore, the sub-light emitting portion SEL may be disposed in the sub-area SA provided between the dam DAM and the upper bank 1172. As a result, in the display apparatus 100 according to another embodiment of the present disclosure, the dam DAM is provided on the lower bank 1171 so that the solution material constituting the sub-light emitting portion SEL may be prevented from flowing toward the main light emitting portion MEL more effectively than the case that there is no dam DAM, whereby the sub-light emitting portion SEL may be more easily formed.

In one embodiment, the dam layer DAM is disposed on the upper surface 1171USA of a first portion of the lower bank 1171. As shown in FIG. 7, the dam layer DAM has an upper surface USDAM and the upper surface USDAM may be equal to or higher than the upper surface USS of the sub-light emitting portion SEL. In one embodiment, the sub-light emitting portion SEL has an oval shape cross-section and the upper surface USDAM of the dam DAM may be equal to or higher than the highest upper surface USS of the sub-light emitting portion SEL. As depicted, the height or the thickness of the highest upper surface USS of the sub-light emitting portion SEL is labeled as ST.

Referring to FIG. 7, in the display apparatus 100 according to another embodiment of the present disclosure, a thickness DT of the dam DAM may be equal to or greater than the thickness ST of the sub-light emitting portion SEL. When the thickness DT of the dam DAM is thinner than the thickness ST of the sub-light emitting portion SEL, the solution material coated on the sub-area SA flows toward the main light emitting portion MEL so that the thickness of the main light emitting portion MEL may be thicker than that of the sub-light emitting portion SEL. In this case, since a color of the light emitted from the main light emitting portion MEL and a color of the light emitted from the sub-light emitting portion SEL may vary, color purity may be deteriorated. Therefore, in the display apparatus 100 according to another embodiment of the present disclosure, the thickness DT of the dam DAM may be equal to or greater than the thickness ST of the sub-light emitting portion SEL, so that the thickness of the main light emitting portion MEL and the thickness of the sub-light emitting portion SEL may be similar to or the same as each other, whereby luminance may be improved without deterioration of color purity.

Meanwhile, in the display apparatus 100 according to another embodiment of the present disclosure, since the lower bank 1171 is provided to further include a dam DAM, the sub-electrode 114*b* may be exposed from the sub-area SA between the dam DAM and the upper bank 1172. The sub-electrode 114*b* exposed from the sub-area SA may be in contact with the lower surface of the sub-light emitting portion SEL. In addition, the second electrode 115 formed in a subsequent process may be provided on the main light emitting portion MEL, the sub-light emitting portion SEL, the lower bank 1171, the upper bank 1172 and the DAM. In more detail, the second electrode 115, which is a common electrode, may cover an upper surface of the main light emitting portion MEL, an upper surface of the sub-light emitting portion SEL, the inclined surface 1171*b* of the lower bank 1171, an inclined surface and an upper surface of the dam DAM, the inclined surface 1172*b* of an upper bank 1172 not contacting the sub-light emitting portion SEL and the upper surface 1172*a* of the upper bank 1172.

As a result, in the display apparatus 100 according to another embodiment of the present disclosure, the second electrode 115 on the main light emitting portion MEL may form an electric field with the main electrode 114*a*, and the second electrode 115 on the sub-light emitting portion SEL provided between the dam DAM and the upper bank 1172 may form an electric field with the sub-electrode 114*b* exposed without being covered by the lower bank 1171. Therefore, in the display apparatus 100 according to another embodiment of the present disclosure, the sub-light emitting portion SEL may be easily formed due to the dam DAM and the upper bank 1172, and a viewing angle and/or luminance may be improved due to the sub-light emitting portion SEL disposed to be adjacent to each of the dam DAM and the upper bank 1172 on the lower bank 1171 separately from the main light emitting portion MEL.

In the display apparatus 100 according to the present disclosure, as shown in FIGS. 2 and 6, two sub-light emitting portions SEL may be provided at both sides of the main light emitting portion MEL of one subpixel SP, but the present disclosure is not limited thereto. Only one sub-light emitting portion SEL may be provided at one side of the main light emitting portion MEL. In this case, the first electrode 114 may include only one sub-electrode 114*b* connected to one side of the main electrode 114*a*. The lower bank 1171 may be provided to cover the edge of the main electrode 114*a* of one subpixel SP and a portion of the sub-electrode 114*b* of an adjacent subpixel SP. Even in this case, in the display apparatus 100 according to the present disclosure, the sub-light emitting portion SEL is provided on the upper surface of the lower bank 1171 while being closer to the upper bank 1172 than the main light emitting portion MEL, so that the viewing angle may be improved without deterioration of front luminance. Also, in this case, since the lower bank 1171 does not need to cover the two sub-electrodes 114*b* of different subpixels SP, the width of the lower bank 1171 may be reduced as compared with the case that the lower bank 117 covers the two sub-electrodes 114*b*. Therefore, since the plurality of subpixels SP disposed on the first substrate 110 may be integrated with high density, high resolution may be more easily implemented.

According to the present disclosure, the following advantageous effects may be obtained.

In the present disclosure, the sub-light emitting portion is provided on the bank, so that the viewing angle may be improved without deterioration of front luminance.

Also, in the present disclosure, the sub-light emitting portion is additionally provided in each subpixel separately from the main light emitting portion, so that luminance may be improved.

In addition, in the present disclosure, the lower bank includes the dam protruded upwardly while being spaced apart from the upper bank, so that the liquid organic light emitting material on the lower bank may be trapped when the liquid organic light emitting material is coated on the lower bank, whereby the sub-light emitting portion may be easily manufactured.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is intended to cover all variations or modifications derived from the meaning, scope and equivalent concept described in the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a substrate provided with a plurality of subpixels; and
a plurality of banks adjacent to the plurality of subpixels on the substrate,
wherein each of the plurality of subpixels includes:
a main light emitting portion provided between adjacent banks of the plurality of banks; and
a sub-light emitting portion spaced apart from the main light emitting portion and disposed to be higher than the main light emitting portion, and
wherein the sub-light emitting portion includes a light emitting layer.

2. The display apparatus of claim 1, wherein the sub-light emitting portion is on each of the plurality of banks.

3. The display apparatus of claim 1, wherein each of the plurality of banks includes:
a lower bank partially adjacent to the main light emitting portion on the substrate; and
an upper bank on the lower bank, and
wherein the sub-light emitting portion is in contact with the upper bank on the lower bank.

4. The display apparatus of claim 3, wherein an upper surface of the upper bank is higher than an upper surface of the sub-light emitting portion.

5. The display apparatus of claim 3, wherein the upper bank is spaced apart from the main light emitting portion, and
wherein a width of the upper bank is narrower than that of the lower bank.

6. The display apparatus of claim 3, wherein the lower bank has hydrophilic properties, and the upper bank has hydrophobic properties.

7. The display apparatus of claim 3, wherein each of the subpixels includes a first electrode provided on the substrate and partially covered by the lower bank,
the first electrode including:
a main electrode overlapped with the main light emitting portion below the main light emitting portion; and
a sub-electrode connected to the main electrode and partially overlapped with the sub-light emitting portion.

8. The display apparatus of claim 7, further comprising:
a second electrode covering the main light emitting portion, the sub-light emitting portion, the lower bank, and the upper bank,
wherein the sub-light emitting portion is disposed between the second electrode covering the lower bank and the sub-electrode, and
wherein the second electrode is continuously connected at least between two adjacent subpixels of the plurality of subpixels.

9. The display apparatus of claim 7, wherein the lower bank includes a sub-area between the main light emitting portion and the upper bank, and
wherein at least a portion of the sub-electrode is exposed from the sub-area to be in contact with the sub-light emitting portion.

10. The display apparatus of claim 9, wherein a width of the sub-light emitting portion is wider than a width of the sub-electrode exposed from the sub-area.

11. The display apparatus of claim 9, wherein the upper bank does not overlap or partially overlaps the sub-electrode exposed from the sub-area in a thickness direction of the substrate.

12. The display apparatus of claim 7, wherein at least a portion of the sub-electrode is thicker than the main electrode.

13. The display apparatus of claim 3, wherein the lower bank is provided in a lattice shape, and the upper bank is provided in a stripe shape.

14. The display apparatus of claim 1, wherein the plurality of subpixels include a first subpixel and a second subpixel adjacent to the first subpixel,
wherein the plurality of banks include a first bank between the first subpixel and the second subpixel,
wherein the first bank includes a lower bank partially adjacent to the main light emitting portion and an upper bank on the lower bank,
wherein the main light emitting portion includes a first main light emitting portion provided in the first subpixel and a second main light emitting portion provided in the second subpixel,
wherein the sub-light emitting portion includes a first sub-light emitting portion spaced apart from the first main light emitting portion and disposed to be higher than the first main light emitting portion and a second sub-light emitting portion spaced apart from the second main light emitting portion and disposed to be higher than the second main light emitting portion,
wherein the first sub-light emitting portion is in contact with one side of the upper bank on the lower bank, and
wherein the second sub-light emitting portion is in contact with the other side of the upper bank on the lower bank.

15. The display apparatus of claim 14, wherein the first sub-light emitting portion emits light of a color different from that of the second sub-light emitting portion.

16. A display apparatus, comprising:
a substrate provided with a plurality of subpixels, and
a plurality of banks adjacent to the plurality of subpixels on the substrate,
wherein each of the plurality of subpixels includes:
a main light emitting portion provided between adjacent banks of the plurality of banks; and
a sub-light emitting portion spaced apart from the main light emitting portion and disposed to be higher than the main light emitting portion, wherein each of the plurality of banks includes:
a lower bank partially adjacent to the main light emitting portion on the substrate; and
an upper bank above the lower bank, and
wherein the lower bank includes a dam spaced apart from the upper bank and protruded upwardly.

17. The display apparatus of claim 16, further comprising:
a sub-area between the dam and the upper bank on the lower bank,
wherein at least a portion of the sub-light emitting portion is in the sub-area.

18. The display apparatus of claim 17, wherein a thickness of the dam is equal to or thicker than that of the sub-light emitting portion.

19. The display apparatus of claim 17, wherein each of the subpixels includes a first electrode provided on the substrate and partially covered by the lower bank,
the first electrode including:
a main electrode overlapped with the main light emitting portion below the main light emitting portion; and
a sub-electrode connected to the main electrode, being in contact with the sub-light emitting portion in the sub-area.

20. The display apparatus of claim 19, further comprising:
a second electrode on the main light emitting portion, the sub-light emitting portion, the lower bank, the upper bank, and the dam, wherein the second electrode on the main light emitting portion forms an electric field with the main electrode, wherein the second electrode on the sub-light emitting portion forms an electric field with the sub-electrode, and wherein the second electrode is continuously connected over the main light emitting portion, the sub-light emitting portion, the lower bank, the upper bank, and the dam.

21. A display apparatus, comprising:

a substrate having a first surface and a second surface opposite the first surface;

a light emitting element on the first surface of the substrate, the light emitting element including a first electrode and a second electrode on the first electrode, and a light emitting layer between the first electrode and the second electrode, the light emitting layer having a main light emitting portion and a sub-light emitting portion spaced apart from the main light emitting portion, and the first electrode including a first portion and a second portion contiguous to the first portion, wherein the main light emitting portion is on the first portion of the first electrode and the sub-light emitting portion is disposed on the second portion of the first electrode, and wherein the sub-light emitting portion includes a light emitting layer.

22. The display apparatus of claim 21, wherein the second portion of the first electrode protrudes upward in a direction opposite of the first surface of the substrate sufficiently that an upper surface of the second portion of the first electrode is higher than an upper surface of the first portion of the first electrode.

23. The display apparatus of claim 22, comprising a first bank layer disposed on both adjacent sides of the second portion of the first electrode, a first section of the first bank layer being on one adjacent side of the second portion of the first electrode and a second section of the first bank layer on an opposite adjacent side of the second portion of the first electrode, the first section of the first bank layer being disposed on and contacting both the first and second portions of the first electrode.

24. The display apparatus of claim 23, wherein the second portion of the first electrode includes a trapezoid shaped cross-section having the upper surface of the second portion of the first electrode flush with an upper surface of the first bank layer.

25. The display apparatus of claim 23, wherein the second electrode contacts at least one surface of the portion of the first bank layer.

26. The display apparatus of claim 25, wherein a bottom surface of the second electrode gradually spaces apart from the at least one surface of the portion of the first bank layer as the second electrode extends towards the main light emitting portion.

27. The display apparatus of claim 26, wherein the sub-light emitting portion has a thickness that gradually increases and then gradually decreases as the sub-light emitting portion approaches a second bank layer disposed on the second section of the first bank layer.

28. The display apparatus of claim 23, wherein an upper surface of the second electrode in a location overlapping the main light emitting portion is lower than an upper surface of the second electrode in a location overlapping the sub-light emitting portion.

29. The display apparatus of claim 23, comprising a second bank layer disposed on the second section of the first bank layer, wherein the second bank layer contacts at least a portion of the sub-light emitting portion.

30. The display apparatus of claim 29, wherein the second bank layer disposed on the second section of the first bank layer includes different material from the first bank layer.

31. The display apparatus of claim 23, comprising a dam layer disposed on the first section of the first bank layer, wherein an upper surface of the dam layer is equal to or higher than an upper surface of the sub-light emitting portion.

32. The display apparatus of claim 31, wherein the second electrode is continuously and contiguously disposed on the upper surface of the dam layer, the upper surface of the sub-light emitting portion, the first section of the first bank layer, and an upper surface of the main light emitting portion.

33. The display apparatus of claim 31, wherein the dam layer and first bank layer are made of a same material.

* * * * *